US008088307B2

(12) United States Patent
Heo et al.

(10) Patent No.: US 8,088,307 B2
(45) Date of Patent: Jan. 3, 2012

(54) METAL PASTE FOR FORMING A CONDUCTIVE LAYER

(75) Inventors: Soon Yeong Heo, Daegu (KR); Seong Sil Park, Daegu (KR); Seung Jun Han, Kyungsangnam-do (KR); Hyun Myung Jang, Pohang-si (KR)

(73) Assignee: Exax Inc., Gumi-Si (KR)

( * ) Notice: Subject to any disclaimer, the term of this patent is extended or adjusted under 35 U.S.C. 154(b) by 0 days.

(21) Appl. No.: 11/916,956

(22) PCT Filed: May 25, 2007

(86) PCT No.: PCT/KR2007/002561
§ 371 (c)(1),
(2), (4) Date: Nov. 17, 2009

(87) PCT Pub. No.: WO2008/093915
PCT Pub. Date: Aug. 7, 2008

(65) Prior Publication Data
US 2010/0123102 A1    May 20, 2010

(30) Foreign Application Priority Data

Jan. 30, 2007 (KR) .................. 10-2007-0009177

(51) Int. Cl.
*H01B 1/22* (2006.01)
(52) U.S. Cl. .................. 252/512; 252/514
(58) Field of Classification Search .......... 252/512–514; 106/1.19
See application file for complete search history.

(56) References Cited

U.S. PATENT DOCUMENTS 4,434,084 A * 2/1984 Hicks et al. .................. 252/512
2006/0289837 A1* 12/2006 McNeilly et al. ............. 252/500

(Continued)

FOREIGN PATENT DOCUMENTS

JP  18-183072 A   7/2006
KR 10-1997-0076901 A  12/1997

(Continued)

OTHER PUBLICATIONS

"International Search Report" for PCT/KR2007/002561, Korean Intellectual Property Office, Oct. 25, 2007, 2 pages, Daejeon, Republic of Korea.

(Continued)

*Primary Examiner* — Mark Kopec
(74) *Attorney, Agent, or Firm* — Elizabeth Eunjoo Kim; Rauschenbach Patent Law Group

(57) ABSTRACT

The present invention provides a metal paste for forming an electrically conductive layer comprising a metal solution in a reactive organic solvent having a heteroatom P, S, O, or N; metal powder; a binder; and a residual amount of a polar or non-polar viscosity modulating solvent.

The metal paste composition according to the present invention has advantages in that it produces structures of layers denser than those conventional metal pastes do; shows characteristics of a much lower electric resistance even with a relatively small thickness or a small line width, as compared with the conductive pattern formed from a conventional paste; and allows heat treatment at a very low temperature even without the use of expensive nano-sized metal particles. The metal paste also provides a silver paste, which can be economically prepared and has high adaptability to various surfaces.

22 Claims, 3 Drawing Sheets

U.S. PATENT DOCUMENTS

2007/0281136 A1* 12/2007 Hampden-Smith
 et al. .................... 428/195.1
2008/0020572 A1* 1/2008 Wu et al. .................... 438/686
2010/0021704 A1* 1/2010 Yoon et al. .................... 428/209

FOREIGN PATENT DOCUMENTS

| KR | 10-1999-0056608 A | 7/1999 |
|----|-------------------|--------|
| KR | 10-2006-0030638 A | 4/2006 |

OTHER PUBLICATIONS

"Written Opinion of the International Searching Authority" for PCT/KR2007/002561, Korean Intellectual Property Office, Oct. 25, 2007, 4 pages, Daejeon, Republic of Korea.

"International Preliminary Report on Patentability" for PCT/KR2007/002561, Korean Intellectual Property Office, Feb. 26, 2009, 3 pages, Daejeon, Republic of Korea.

* cited by examiner

[Fig. 1]
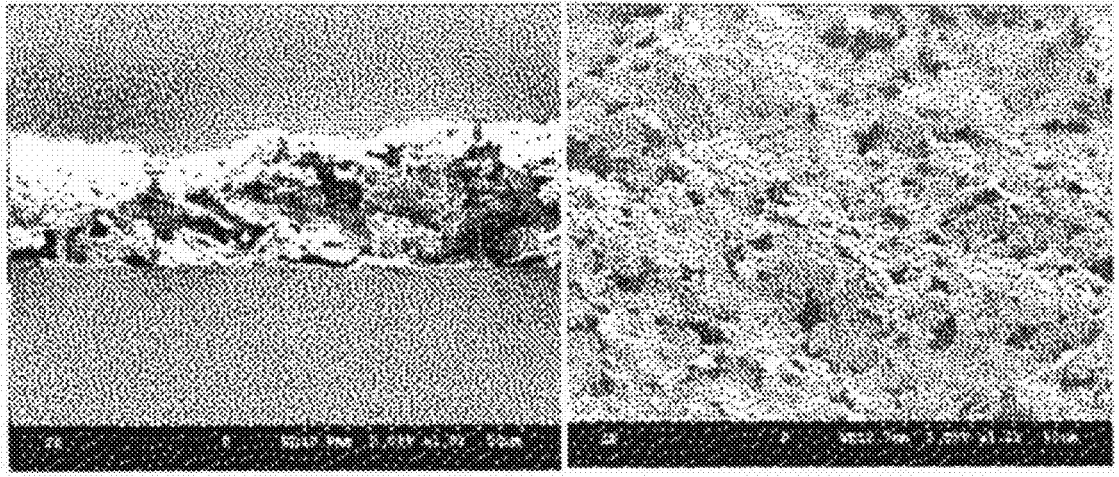
[Fig. 2]
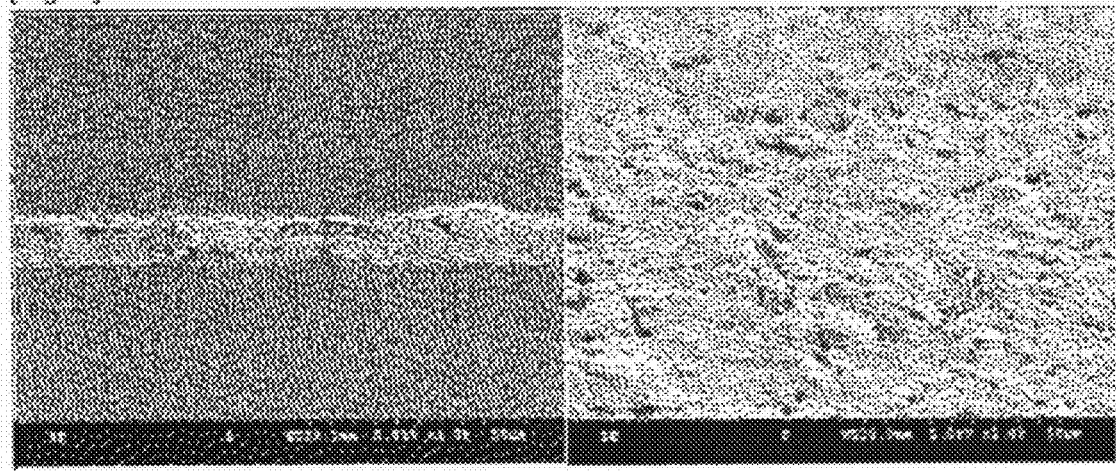
[Fig. 3]
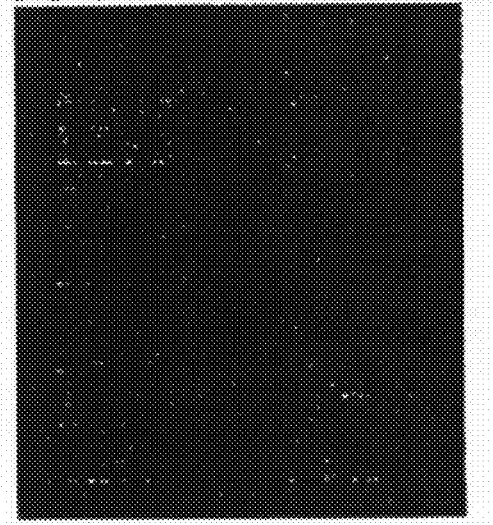

[Fig. 4]
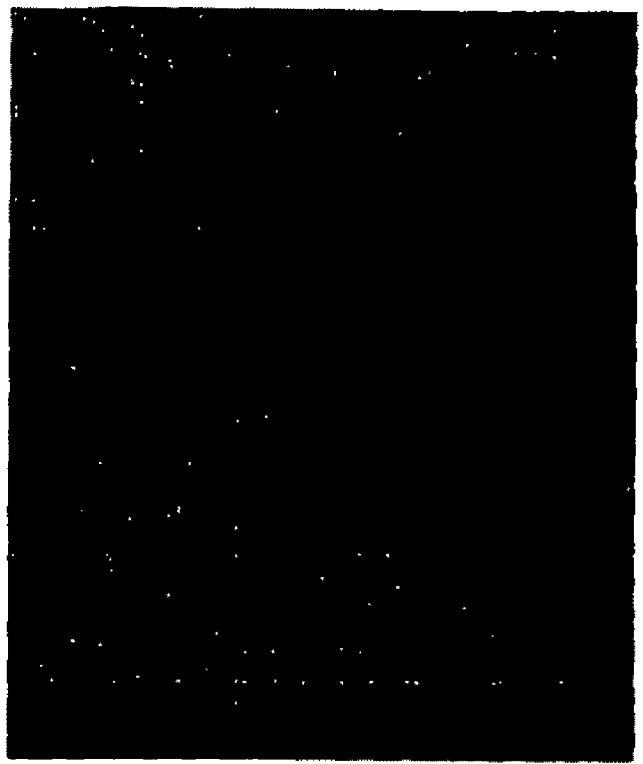
[Fig. 5]
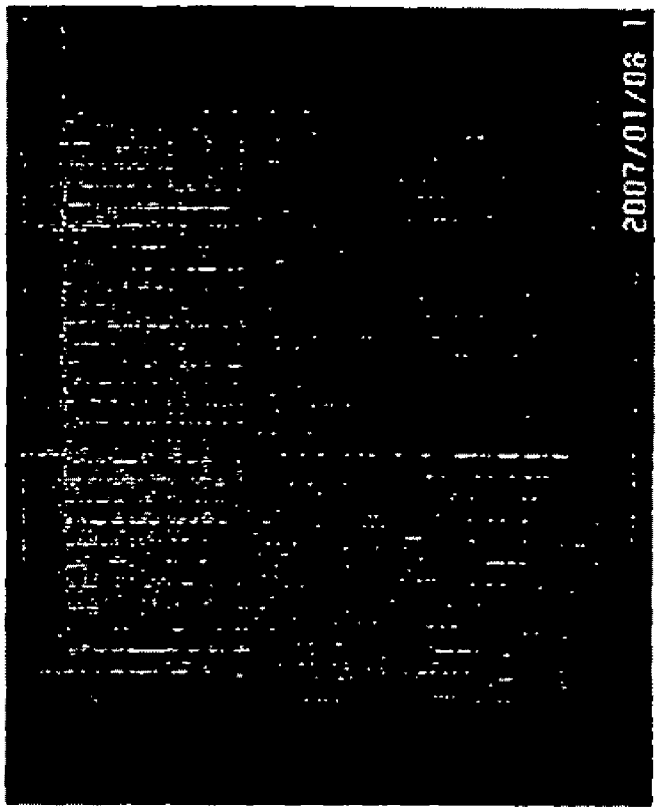

METAL PASTE FOR FORMING A CONDUCTIVE LAYER

TECHNICAL FIELD

The present invention relates to a metal paste for forming an electrically conductive layer. The conductive layers are formed as conductive patterns in flat panel displays such as an LCD (liquid crystal display) and a PDP (plasma display panel), electrodes of a touch screen, PAD electrodes of a flat fluorescent lamp (FFL) backlight, electrodes of a flexible PCB, and RFID antennas.

BACKGROUND ART

In semiconductor and display industries, pattern forming technologies are classified into 3 categories. One is a subtractive method mainly applied to thin film technologies wherein a functional layer is deposited on a substrate, a photo-resist layer is patterned by lithography on the functional layer, and then the functional layer is etched into a pattern. Another is an additive method of contact printing such as screen-printing used primarily in thick film technologies. The other is a subtractive-additive method adopting both of a subtractive method and an additive method.

The formation of an electrically conductive pattern used for a display usually employs an additive method, which includes a step for forming a continuous pattern with an appropriate ink or paste by a contact or a non-contact printing method and a step for post-treatment to fix it on a substrate. In some cases, a subtractive/additive process further comprising a step of etching may be employed.

A number of studies to ink for forming a pattern by using an MOD material have been made ever since Vest, R.W. tested inks made of MOD material (IEEE Transactions on Components, Hybrids and Manufacturing Technology, 12(4), 545-549, 1987).

Herein, MOD (metallo-organic decomposition) material means an organic metal compound, which is decomposed and metallized at a temperature lower than the melting point of a metal.

U.S. Pat. No. 6,878,184 (issued to Kovio, Inc.) disclosed a technology for ink having nanoparticles formed from an MOD and a reducing agent (for example, aldehyde). However, this technology requires a stringent reaction condition, and a large amount of expensive MOD material. Further, the formed nanoparticles cannot provide sufficient electrical conductivity.

The advantage of MOD inks and inks made of suspended nanoparticles has relatively low metallization temperatures. However, they are disadvantageous in that they require high cost, and the electrical conductivity is remarkably reduced, as compared with that of a bulk metal.

International Patent Publication WO98-37133 (issued to Kydd, et al.) suggested a composite composition consisting of a MOD material and a particulate metal for screen printing ink by combining high electrical conductivity of a bulk metal and lower metallization temperature of MOD material. However, this patent does not disclose a printing ink of which the metallization temperature is low enough to be applied on a plastic substrate. Further, since the MOD material and the particulate metal are in the form of particles, further steps for finely pulverizing them with a vehicle by a ball mill are required to prepare the ink. The ink prepared by the above method has poor adaptability to various occasions, and should be used as a manufacturer prescribes.

DISCLOSURE OF INVENTION

Technical Problem

It is an object of the present invention to provide a metal paste for forming an electrically conductive layer having excellent electrical conductivity.

It is another object of the present invention to provide a silver paste, which has excellent electrical conductivity through metallization at a relatively lower temperature, can be economically prepared and has high adaptability to various surfaces.

Technical Solution

According to the present invention, there is provided a paste for forming an electrically conductive layer comprising a metal solution in a reactive organic solvent having a heteroatom P, S, O, or N; metal powder; a binder; and a residual amount of a polar or non-polar viscosity modulating solvent. The reactive organic solvent containing a heteroatom P, S, O or N, is an organic solvent having a ketone group, a mercapto group, a carboxylic group, an aniline group, an ether group, a sulfite group or the like to form a chelate or a complex with a specific metal.

Further, according to the present invention, there is provided a paste for forming an electrically conductive layer, comprising metal solution consisting of an effective amount of metal C1 to C12 aliphatic carboxylate having 1 to 3 carboxyl groups and a reactive organic solvent for dissolving the metal aliphatic carboxylate; metal powder; a binder; and a residual amount of a polar or non-polar viscosity modulating solvent. The reactive organic solvent is used to make a solution by dissolving metal aliphatic carboxylate in the solvent. The reactive organic solvent is an organic solvent containing the heteroatom, P, S, O or N as in, for example, a ketone group, a mercapto group, a carboxylic group, an aniline group, an ether group or a sulfite group.

The metal in the present invention is, for example, silver, iron, zinc, tin, nickel, indium, gold, platinum, palladium, antimony, copper or an alloy thereof, but are not limited thereto. The metals of the metal solution and the metals for the metal powder may be different from each other, but are preferably the same. In the paste, the metal solution is contained in an amount of preferably 0.1 to 90 w %, most preferably 0.1 to 40 w %, and the metal powder are contained in an amount of preferably 1 to 95 w %, most preferably 1 to 65 w %. The metal powder has an average particle diameter of micrometer scale, for example, in the range of preferably 0.1 to 10 micrometers, most preferably 1 to 5 micrometers.

The metal paste composition of the present invention is characterized in that the metal ink, that is, the organic metal solution is used as a vehicle of the metal paste. The metallization temperature of it is lower than that of a paste comprising conventional metal powder plus a vehicle. The paste of the present invention can be schematically illustrated as shown in FIG. 6. In addition, it is prepared more easily than the mixed, pulverized product of the conventional metal powder plus MOD powder.

The metal paste of the present invention means metal suspended in a solution, and the viscosity thereof can be controlled according to the purpose of use. This metal paste can be employed for various printing methods such as gravure, flexo, screen, rotary, dispenser, and offset printings, after modulating the viscosity and adding an appropriate binder. The viscosity for coating is in the range of 1 to 70,000 cPs. In the case of silkscreen, the viscosity is in the range of 10,000 to 35000 cPs, preferably 10,000 to 20,000 cPs.

The binder is, broadly, natural or synthetic polymeric compounds, or a mixture thereof. For example, rosin formulation, urethane-, acryl- and epoxy-based thermosetting binders can be used as the binder. The amount of the binder used is generally 0.1 to 15 w % of the paste, preferably 1 to 13 w %. If the amount is more than 15%, the conductivity becomes poor, whereas if the amount is less than 0.1%, the binding power becomes lower.

Preferably, the metal is particularly silver. As a preferred embodiment, there is provided a paste for forming an electrically conductive layer, comprising 0.1 to 90 w % of a silver solution consisting of an effective amount of silver C1 to C12 aliphatic carboxylate having 1 to 3 carboxyl groups and a reactive organic solvent for dissolving the silver aliphatic carboxylate; 1 to 60 w % of silver powder; 1 to 13 w % of a binder; and a residual amount of a polar or non-polar viscosity modulating solvent.

The silver aliphatic carboxylate may be linear or branched, or substituted by an amino group, a nitro group or a hydroxy group. The reactive organic solvent is preferably amine substituted by one or more C1 to C6 aliphatic group which may be substituted by hydroxyl, or a C1 to C16 linear or branched aliphatic thiol. The silver aliphatic carboxylate is preferably saturated or has one or two double bonds. For example, it includes silver maleate, silver malonate, silver succinate, silver acetate, silver malate, silver methacrylate, silver propionate, silver sorbate, silver citrate, silver undecylenate, silver neo-decanate, silver oleate, silver oxalate, silver formate, silver gluconate, or a mixture thereof, preferably silver citrate, silver oxalate, silver formate, silver maleate and a mixture thereof.

The silver solution is preferably contained in an amount of 0.1 to 40 w % of the total paste.

The silver powder has an average particle diameter of a micrometer scale, for example, in the range of 0.1 to 10 micrometers, most preferably in the range of 1 to 5 micrometers. The silver powder is preferably plate-like.

The reactive organic solvent is preferably methylamine, ethylamine, isopropylamine, monoethanolamine, diethanolamine, triethanolamine, or a linear saturated aliphatic thiol containing 5 to 14 carbon atoms, most preferably ethylamine.

The polar or non-polar solvent is C1 to C4 aliphatic alcohol having a mono- to tri-valent hydroxyl group, C2 to C8 alkyl ether of the aliphatic alcohol or C2 to C8 alkyl ester of the aliphatic alcohol, for example, butylcarbitol acetate, butylcarbitol, ethylcarbitol, ethylcarbitol acetate, terpineol, texanol, menthanol, isoamyl acetate, methanol, ethanol, and a mixture thereof.

ADVANTAGEOUS EFFECTS

The metal paste composition according to the present invention has advantages in that it produces structures of layers denser than those conventional metal pastes do; shows characteristics of a much lower electric resistance even with a relatively small thickness or a small line width, as compared with the conductive pattern formed from a conventional paste; and allows heat treatment at a very low temperature even without the use of expensive nano-sized metal particles. The metal paste also provides a silver paste, which can be economically prepared and has high adaptability to various surfaces.

Further, the silver paste of the present invention can be applied not only on a glass substrate but on a plastic substrate such as PET, particularly on a polyimide substrate used as a substrate for flexible PCB. The silver paste also can be adopted in flexible display of a next generation, a touch panel, flexible PCB, RFID or the like in the viewpoint of cost effectiveness.

FIG. 6 shows a schematic illustration of a paste of the present invention.

BRIEF DESCRIPTION OF THE DRAWINGS

FIG. 1 shows an SEM photograph of an electrically conductive layer on a glass substrate of a conventional silver paste made from silver powder and a vehicle;

FIG. 2 shows an SEM photograph of an electrically conductive layer on a glass substrate of the silver paste composition of the present invention; and FIGS. 3, 4, and 5 show the photographs of the conductive layers formed by silkscreen printing on a glass substrate, a PET substrate or a polyimide substrate respectively with the silver paste composition of the present invention.

BEST MODE FOR CARRYING OUT THE INVENTION

Figure 6:
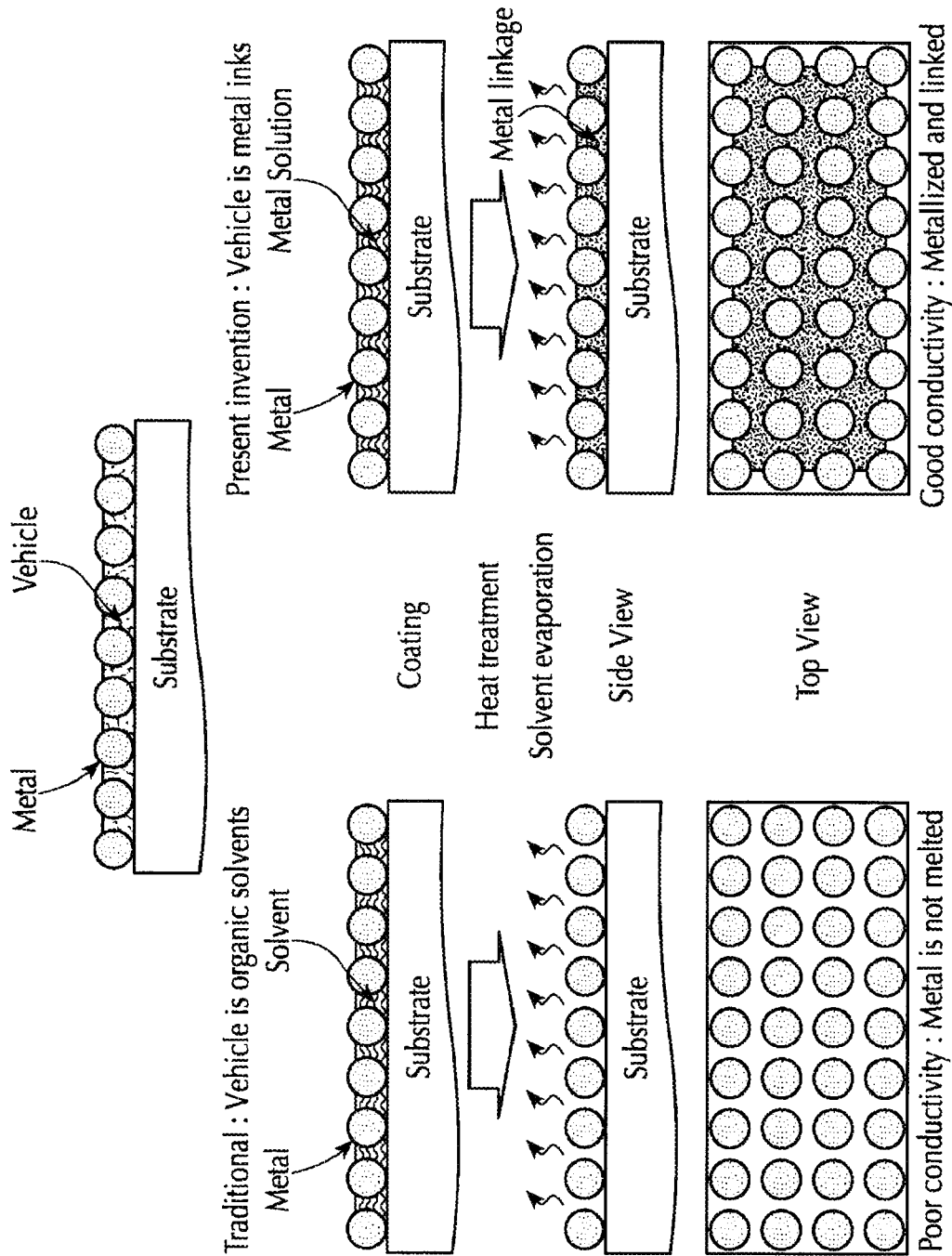

Hereinbelow, the present invention will be described with reference to Examples. These Examples are provided only for the purpose of illustrating the present invention, and it should not be construed that the scope of the present invention be limited thereto. As the plate-like silver powder, a plate-like silver powder having a diameter 50 times more than the thickness, and an average particle diameter of 3 micrometers, is used. As a binder, a blend of KER3001 (trade name) epoxy-based resin manufactured by Kumho P&B Chemicals Inc. (Korea) and 2-ethylimidazole manufactured by Aldrich Chemical Co. as a curing agent in a ratio of 95:5, was used. In the Examples, the silver aliphatic carboxylate solution was added in the amounts of 2, 4, 6, 10, 16, and 20 w %, respectively. The silver ink as used herein means the same as the silver solution.

Comparative Example 1

100 g of a paste composition is prepared by mixing thoroughly mixing 60 g of a plate-like silver powder (having an average particle diameter of 3 micrometers which is about 50 times more of the thickness), 14.38 g of normal terpineol, 2.5 g of butylcarbitol acetate, and a residual amount of ethanol. The paste composition was coated on a glass substrate, heat-treated at 130° C., 200° C. and 250° C., respectively, and measured on its line resistances using a 2-probe device. The results thereof are shown in Table 1. A silver film coated on the glass substrate and heat-treated at 200° C. was cut for comparison with those of the paste of the present invention, and the cross-section and surface thereof were observed by SEM. The images thereof are shown in FIG. 1.

Example 1

50 mmol of formic acid is dissolved in 50 mL of methanol. 50 mmol NaOH dissolved in 50 mL water is added slowly to the formic acid solution prepared while stirring to form sodium formate. 50 mmol silver nitrate dissolved in 50 mL water is added to the sodium formate, and then white precipitate IS formed fast. The precipitates were sufficiently washed with water to remove unreacted silver nitrate and NaOH, and then filtered, and the residue was washed with methanol again, and dried at ambient temperature to prepare silver formate.

0.1 mol of the silver formate thus formed was completely dissolved in 0.12 mol of ethylamine, and added with methanol, while adjusting a total weight to 50 g. Continuously, the mixture was sufficiently stirred for 30 minutes to prepare a completely transparent silver formate ink.

2 g of the prepared silver formate ink, 59.4 g of plate-like silver powder having an average particle size of 3 micrometers, 14.4 g of normal terpineol, 2.5 g of butylcarbitol acetate, 4 g of an epoxy binder, and a residual amount of ethanol was put together and mixed to prepare 100 g of a paste composition.

The paste composition was screen printed on a glass substrate, a PET substrate, or a polyimide substrate, and heat-treated at 130° C., 200° C., and 250° C., respectively, and characterized by measuring the line resistance using a 2-probe apparatus. Separately, the silver film coated on the glass substrate was cut for comparison with those of the conventional pastes, and the cross-section and surface thereof were observed by SEM. The viscosity of the coated film, and the adhesive power and electric resistance of the heat-treated coated film are summarized in Table 1.

Example 2

The silver formate ink as prepared in Example 1 was used. The same procedure as in Example 1, except that 4 g of the silver formate ink and 58.8 g of the plate-like silver powder were used, was carried out to prepare a paste composition, and then to test the applications. The viscosity of the coated film, and the adhesive power and electric resistance of the heat-treated coated film are summarized in Table 1.

Example 3

The silver formate ink as prepared in Example 1 was used. The same procedure as in Example 1, except that 6 g of the silver formate ink and 58.2 g of the plate-like silver powder were used, was carried out to prepare a paste composition, and then to test the applications. The viscosity of the coated film, and the adhesive power and electric resistance of the heat-treated coated film are summarized in Table 1.

Example 4

The silver formate ink as prepared in Example 1 was used. The same procedure as in Example 1, except that 10 g of the silver formate ink and 57 g of the plate-like silver powder were used, was carried out to prepare a paste composition, and then to test the applications. The viscosity of the coated film, and the adhesive power and electric resistance of the heat-treated coated film are summarized in Table 1.

Example 5

The silver formate ink as prepared in Example 1 was used. The same procedure as in Example 1, except that 16 g of the silver formate ink and 55.2 g of the plate-like silver powder were used, was carried out to prepare a paste composition, and then to test the applications. The viscosity of the coated film, and the adhesive power and electric resistance of the heat-treated coated film are summarized in Table 1.

Example 6

The silver formate ink as prepared in Example 1 was used. The same procedure as in Example 1, except that 20 g of the silver formate ink and 54 g of the plate-like silver powder were used, was carried out to prepare a paste composition, and then to test the applications. The viscosity of the coated film, and the adhesive power and electric resistance of the heat-treated coated film are summarized in Table 1.

Example 7

The same procedure as in Example 1, except that oxalic acid was used instead of formic acid, was carried out to prepare a silver oxalate ink. The same procedure as in Example 1, except that 2 g of the silver oxalate ink and 59.4 g of the plate-like silver powder were used, was carried out to prepare a paste composition, and then to test the applications. The viscosity of the coated film, and the adhesive power and electric resistance of the heat-treated coated film are summarized in Table 1.

Example 8

The same procedure as in Example 7, except that 4 g of the silver oxalate ink and 58.8 g of the plate-like silver powder were used, was carried out.

Example 9

The same procedure as in Example 7, except that 6 g of the silver oxalate ink and 58.2 g of the plate-like silver powder were used, was carried out.

Example 10

The same procedure as in Example 7, except that 10 g of the silver oxalate ink and 57 g of the plate-like silver powder were used, was carried out. Particularly, the SEM images viewed along the cross-section and the surface, respectively of the coated film on the glass substrate which had been heat-treated at 200° C. are shown in FIG. 2. It can be shown that it has a more compact structure that that of FIG. 1. FIGS. 3, 4 and 5 show the photographs obtained by screen printing the pastes on a glass substrate, a PET substrate, or a polyimide substrate, respectively, and then heat-treating them at 200° C.

Example 11

The same procedure as in Example 7, except that 16 g of the silver oxalate ink and 55.2 g of the plate-like silver powder were used, was carried out.

Example 12

The same procedure as in Example 7, except that 20 g of the silver oxalate ink and 54 g of the plate-like silver powder were used, was carried out.

Example 13

The same procedure as in Example 1, except that citric acid was used instead of formic acid, was carried out to prepare a silver citrate ink. The same procedure as in Example 1, except that 2 g of the silver citrate ink and 59.4 g of the plate-like silver powder were used, was carried out to prepare a paste composition, and then to test the applications. The viscosity of the coated film, and the adhesive power and electric resistance of the heat-treated coated film are summarized in Table 2.

Example 14

The same procedure as in Example 13, except that 4 g of the silver citrate ink and 58.8 g of the plate-like silver powder were used, was carried out.

Example 15

The same procedure as in Example 13, except that 6 g of the silver citrate ink and 58.2 g of the plate-like silver powder were used, was carried out.

Example 16

The same procedure as in Example 13, except that 10 g of the silver citrate ink and 57 g of the plate-like silver powder were used, was carried out.

Example 17

The same procedure as in Example 13, except that 16 g of the silver citrate ink and 55.2 g of the plate-like silver powder were used, was carried out.

Example 18

The same procedure as in Example 13, except that 20 g of the silver citrate ink and 54 g of the plate-like silver powder were used, was carried out.

Example 19

The same procedure as in Example 1, except that malic acid was used instead of formic acid, was carried out to prepare a silver malate ink. The same procedure as in Example 1, except that 2 g of the silver malate ink and 59.4 g of the plate-like silver powder were used, was carried out to prepare a paste composition, and then to test the applications. The viscosity of the coated film, and the adhesive power and electric resistance of the heat-treated coated film are summarized in Table 2.

Example 20

The same procedure as in Example 19, except that 4 g of the silver malate ink and 58.8 g of the plate-like silver powder were used, was carried out.

Example 21

The same procedure as in Example 19, except that 6 g of the silver malate ink and 58.2 g of the plate-like silver powder were used, was carried out.

Example 22

The same procedure as in Example 19, except that 10 g of the silver malate ink and 57 g of the plate-like silver powder were used, was carried out.

Example 23

The same procedure as in Example 19, except that 16 g of the silver malate ink and 55.2 g of the plate-like silver powder were used, was carried out.

Example 24

The same procedure as in Example 19, except that 20 g of the silver malate ink and 54 g of the plate-like silver powder were used, was carried out.

TABLE 1

| | Silver formate, Silver oxalate | 130° C. | | | 200° C. | | | 250° C. | | |
|---|---|---|---|---|---|---|---|---|---|---|
| | | Resistance | Viscosity (cPs) | Hardness | Resistance | Viscosity (cPs) | Hardness | Resistance | Viscosity (cPs) | Hardness |
| Comp. Ex. 1 | Glass | 0.552Ω | 13.120 | 9H | 0.539Ω | 13.120 | 9H | 0.207Ω | 13.120 | 9H |
| Ex. 1 | PET | 0.548Ω | 13.420 | 9H | — | 13.420 | 9H | — | 13.420 | 9H |
| | Polyimide | 0.551Ω | 13.420 | 9H | 0.533Ω | 13.420 | 9H | 0.231Ω | 13.420 | 9H |
| | Glass | 0.421Ω | 13.150 | 9H | 0.423Ω | 13.150 | 9H | 0.204Ω | 13.150 | 9H |
| Ex. 2 | PET | 0.427Ω | 13.150 | 9H | — | 13.150 | 9H | — | 13.150 | 9H |
| | Polyimide | 0.424Ω | 13.150 | 9H | 0.489Ω | 13.150 | 9H | 0.206Ω | 13.150 | 9H |
| | Glass | 0.255Ω | 12.800 | 9H | 0.403Ω | 12.800 | 9H | 0.201Ω | 12.800 | 9H |
| Ex. 3 | PET | 0.257Ω | 12.800 | 9H | — | 12.800 | 9H | — | 12.800 | 9H |
| | Polyimide | 0.260Ω | 12.800 | 9H | 0.400Ω | 12.800 | 9H | 0.199Ω | 12.800 | 9H |
| | Glass | 0.244Ω | 12.100 | 9H | 0.253Ω | 12.100 | 9H | 0.189Ω | 12.100 | 9H |
| Ex. 4 | PET | 0.239Ω | 12.100 | 9H | — | 12.100 | 9H | — | 12.100 | 9H |
| | Polyimide | 0.243Ω | 12.100 | 9H | 0.221Ω | 12.100 | 9H | 0.188Ω | 12.100 | 9H |
| | Glass | 0.211Ω | 11.600 | 9H | 0.186Ω | 11.600 | 9H | 0.189Ω | 11.600 | 9H |
| Ex. 5 | PET | 0.208Ω | 11.600 | 9H | — | 11.600 | 9H | — | 11.600 | 9H |
| | Polyimide | 0.205Ω | 11.600 | 9H | 0.199Ω | 11.600 | 9H | 0.163Ω | 11.600 | 9H |
| | Glass | 0.242Ω | 11.300 | 9H | 0.250Ω | 11.300 | 9H | 0.222Ω | 11.300 | 9H |
| Ex. 6 | PET | 0.252Ω | 11.300 | 9H | — | 11.300 | 9H | — | 11.300 | 9H |
| | Polyimide | 0.249Ω | 11.300 | 9H | 0.241Ω | 11.300 | 9H | 0.227Ω | 11.300 | 9H |
| | Glass | 0.552Ω | 13.420 | 9H | 0.539Ω | 13.420 | 9H | 0.207Ω | 13.420 | 9H |
| Ex. 7 | Glass | 0.651Ω | 13.420 | 9H | 0.471Ω | 13.420 | 9H | 0.246Ω | 13.420 | 9H |
| | PET | 0.673Ω | 13.420 | 9H | — | 13.420 | 9H | — | 13.420 | 9H |
| | Polyimide | 0.667Ω | 13.420 | 9H | 0.473Ω | 13.420 | 9H | 0.252Ω | 13.420 | 9H |

TABLE 1-continued

| | Silver formate, Silver oxalate | 130° C. | | | 200° C. | | | 250° C. | | |
|---|---|---|---|---|---|---|---|---|---|---|
| | | Resistance | Viscosity (cPs) | Hardness | Resistance | Viscosity (cPs) | Hardness | Resistance | Viscosity (cPs) | Hardness |
| Ex. 8 | Glass | 0.478Ω | 13.150 | 9H | 0.423Ω | 13.150 | 9H | 0.204Ω | 13.150 | 9H |
| | PET | 0.455Ω | 13.150 | 9H | — | 13.150 | 9H | — | 13.150 | 9H |
| | Polyimide | 0.451Ω | 13.150 | 9H | 0.442Ω | 13.150 | 9H | 0.214Ω | 13.150 | 9H |
| Ex. 9 | Glass | 0.308Ω | 12.800 | 9H | 0.255Ω | 12.800 | 9H | 0.196Ω | 12.800 | 9H |
| | PET | 0.312Ω | 12.800 | 9H | — | 12.800 | 9H | — | 12.800 | 9H |
| | Polyimide | 0.316Ω | 12.800 | 9H | 0.249Ω | 12.800 | 9H | 0.189Ω | 12.800 | 9H |
| Ex. 10 | Glass | 0.299Ω | 12.100 | 9H | 0.250Ω | 12.100 | 9H | 0.210Ω | 12.100 | 9H |
| | PET | 0.291Ω | 12.100 | 9H | — | 12.100 | 9H | — | 12.100 | 9H |
| | Polyimide | 0.301Ω | 12.100 | 9H | 0.213Ω | 12.100 | 9H | 0.218Ω | 12.100 | 9H |
| Ex. 11 | Glass | 0.223Ω | 11.600 | 9H | 0.201Ω | 11.600 | 9H | 0.174Ω | 11.600 | 9H |
| | PET | 0.222Ω | 11.600 | 9H | — | 11.600 | 9H | — | 11.600 | 9H |
| | Polyimide | 0.237Ω | 11.600 | 9H | 0.214Ω | 11.600 | 9H | 0.168Ω | 11.600 | 9H |
| Ex. 12 | Glass | 0.274Ω | 11.300 | 9H | 0.251Ω | 11.300 | 9H | 0.222Ω | 11.300 | 9H |
| | PET | 0.281Ω | 11.300 | 9H | — | 11.300 | 9H | — | 11.300 | 9H |
| | Polyimide | 0.284Ω | 11.300 | 9H | 0.242Ω | 11.300 | 9H | 0.227Ω | 11.300 | 9H |

TABLE 2

| | Silver citrate, Silver nalate | 130° C. | | | 200° C. | | | 250° C. | | |
|---|---|---|---|---|---|---|---|---|---|---|
| | | Resistance | Viscosity (cPs) | Hardness | Resistance | Viscosity (cPs) | Hardness | Resistance | Viscosity (cPs) | Hardness |
| Comp. Ex. 1 | Glass | 0.552 Ω | 13.420 | 9H | 0.539 Ω | 13.420 | 9H | 0.207 Ω | 13.420 | 9H |
| Ex. 13 | PET | 0.223 Ω | 13.420 | 9H | 0.237 Ω | 13.420 | 9H | 1.396 Ω | 13.420 | 9H |
| | Polyimide | 0.238 Ω | 13.420 | 9H | — | 13.420 | 9H | — | 13.420 | 9H |
| | Glass | 0.236 Ω | 13.420 | 9H | 0.221 Ω | 13.420 | 9H | 1.104 Ω | 13.420 | 9H |
| Ex. 14 | PET | 0.245 Ω | 13.150 | 9H | 0.196 Ω | 13.150 | 9H | 0.111 Ω | 13.150 | 9H |
| | Polyimide | 0.252 Ω | 13.150 | 9H | — | 13.150 | 9H | — | 13.150 | 9H |
| | Glass | 0.258 Ω | 13.150 | 9H | 0.192 Ω | 13.150 | 9H | 0.126 Ω | 13.150 | 9H |
| Ex. 15 | PET | 0.265 Ω | 12.800 | 9H | 0.183 Ω | 12.800 | 9H | 0.086 Ω | 12.800 | 9H |
| | Polyimide | 0.271 Ω | 12.800 | 9H | — | 12.800 | 9H | — | 12.800 | 9H |
| | Glass | 0.278 Ω | 12.800 | 9H | 0.179 Ω | 12.800 | 9H | 0.080 Ω | 12.800 | 9H |
| Ex. 16 | PET | 0.284 Ω | 12.100 | 9H | 0.177 Ω | 12.100 | 9H | 0.069 Ω | 12.100 | 9H |
| | Polyimide | 0.291 Ω | 12.100 | 9H | — | 12.100 | 9H | — | 12.100 | 9H |
| | Glass | 0.297 Ω | 12.100 | 9H | 0.173 Ω | 12.100 | 9H | 0.048 Ω | 12.100 | 9H |
| Ex. 17 | PET | 0.304 Ω | 11.600 | 9H | 0.171 Ω | 11.600 | 9H | 0.038 Ω | 11.600 | 9H |
| | Polyimide | 0.310 Ω | 11.600 | 9H | — | 11.600 | 9H | — | 11.600 | 9H |
| | Glass | 0.317 Ω | 11.600 | 9H | 0.167 Ω | 11.600 | 9H | 0.017 Ω | 11.600 | 9H |
| Ex. 18 | PET | 0.323 Ω | 11.300 | 9H | 0.165 Ω | 11.300 | 9H | 0.109 Ω | 11.300 | 9H |
| | Polyimide | 0.330 Ω | 11.300 | 9H | — | 11.300 | 9H | — | 11.300 | 9H |
| | Glass | 0.336 Ω | 11.300 | 9H | 0.161 Ω | 11.300 | 9H | 0.116 Ω | 11.300 | 9H |
| Ex. 19 | Glass | 0.651 Ω | 13.420 | 9H | 0.471 Ω | 13.420 | 9H | 0.246 Ω | 13.420 | 9H |
| | PET | 0.673 Ω | 13.420 | 9H | — | 13.420 | 9H | — | 13.420 | 9H |
| | Polyimide | 0.667 Ω | 13.420 | 9H | 0.473 Ω | 13.420 | 9H | 0.252 Ω | 13.420 | 9H |
| Ex. 20 | Glass | 0.479 Ω | 13.150 | 9H | 0.423 Ω | 13.150 | 9H | 0.204 Ω | 13.150 | 9H |
| | PET | 0.455 Ω | 13.150 | 9H | — | 13.150 | 9H | — | 13.150 | 9H |
| | Polyimide | 0.451 Ω | 13.150 | 9H | 0.442 Ω | 13.150 | 9H | 0.214 Ω | 13.150 | 9H |
| Ex. 21 | Glass | 0.308 Ω | 12.800 | 9H | 0.255 Ω | 12.800 | 9H | 0.196 Ω | 12.800 | 9H |
| | PET | 0.312 Ω | 12.800 | 9H | — | 12.800 | 9H | — | 12.800 | 9H |
| | Polyimide | 0.316 Ω | 12.800 | 9H | 0.249 Ω | 12.800 | 9H | 0.189 Ω | 12.800 | 9H |
| Ex. 22 | Glass | 0.299 Ω | 12.100 | 9H | 0.250 Ω | 12.100 | 9H | 0.210 Ω | 12.100 | 9H |
| | PET | 0.291 Ω | 12.100 | 9H | — | 12.100 | 9H | — | 12.100 | 9H |
| | Polyimide | 0.301 Ω | 12.100 | 9H | 0.243 Ω | 12.100 | 9H | 0.218 Ω | 12.100 | 9H |

TABLE 2-continued

| Silver citrate, Silver nalate | 130° C. Resistance | 130° C. Viscosity (cPs) | 130° C. Hardness | 200° C. Resistance | 200° C. Viscosity (cPs) | 200° C. Hardness | 250° C. Resistance | 250° C. Viscosity (cPs) | 250° C. Hardness |
|---|---|---|---|---|---|---|---|---|---|
| Ex. 23 Glass | 0.223 Ω | 11.600 | 9H | 0.201 Ω | 11.600 | 9H | 0.174 Ω | 11.600 | 9H |
| PET | 0.222 Ω | 11.600 | 9H | — | 11.600 | 9H | — | 11.600 | 9H |
| Polyimide | 0.237 Ω | 11.600 | 9H | 0.214 Ω | 11.600 | 9H | 0.168 Ω | 11.600 | 9H |
| Ex. 24 Glass | 0.274 Ω | 11.300 | 9H | 0.251 Ω | 11.300 | 9H | 0.222 Ω | 11.300 | 9H |
| PET | 0.281 Ω | 11.300 | 9H | — | 11.300 | 9H | — | 11.300 | 9H |
| Polyimide | 0.284 Ω | 11.300 | 9H | 0.242 Ω | 11.300 | 9H | 0.227 Ω | 11.300 | 9H |

The invention claimed is:

1. A paste for forming an electrically conductive layer comprising a metal solution consisting of an effective amount of metal C1 to C12 aliphatic carboxylate having 1 to 3 carboxyl groups and a reactive organic solvent for dissolving the metal aliphatic carboxylate, the reactive solvent having a heteroatom P, S, O, or N; metal powder; a binder; and a residual amount of a polar or non-polar viscosity modulating solvent;
wherein the metal powder is plate-like.

2. The paste for forming an electrically conductive layer according to claim 1, wherein the metal is silver, the silver solution is contained in an amount of 0.1 to 90 w %, the silver powder are contained in an amount of 1 to 95 w %, and the binder is contained in an amount of 0.1 to 15 w %.

3. The paste for forming an electrically conductive layer according to claim 2, wherein the reactive organic solvent is selected from the group consisting of an amine substituted by one or more C1 to C6 aliphatic group and a linear or branched C1 to C16 aliphatic thiol.

4. The paste for forming an electrically conductive layer according to claim 3, wherein the silver aliphatic carboxylate is substituted by an amino group, a nitro group, or a hydroxyl group, and the C1 to C6 aliphatic group of the amine as the reactive organic solvent is substituted with a nitro group, or a hydroxyl group.

5. The paste for forming an electrically conductive layer according to claim 3, wherein the silver powder has an average particle diameter of micrometer scale.

6. The paste for forming an electrically conductive layer according to claim 5, wherein the silver aliphatic carboxylate is selected from the group consisting of silver citrate, silver oxalate, silver formate, silver maleate and a mixture thereof.

7. The paste for forming an electrically conductive layer according to claim 6, wherein the binder is a polymeric compound.

8. The paste for forming an electrically conductive layer according to claim 7, wherein the reactive organic solvent is selected from the group consisting of methylamine, ethylamine, isopropylamine, monoethanolamine, diethanolamine, triethanolamine, or a linear, saturated aliphatic thiol containing 5 to 14 carbon atoms.

9. The paste for forming an electrically conductive layer according to claim 8, wherein the binder is a thermosetting binder, and is contained in an amount of 1 to 13 w %, and the silver solution is contained in an amount of 0.1 to 40 w %.

10. The paste for forming an electrically conductive layer according to claim 9, wherein the polar or non-polar solvent is selected from the group consisting of C1 to C4 aliphatic alcohol having a mono- to tri-valent hydroxyl group, C2 to C8 alkyl ether of the aliphatic alcohol or C2 to C8 alkyl ester of the aliphatic alcohol.

11. The paste for forming an electrically conductive layer according to claim 10, wherein the polar or non-polar solvent is selected from the group consisting of butylcarbitol acetate, butylcarbitol, ethylcarbitol, ethylcarbitol acetate, terpineol, texanol, menthanol, isoamyl acetate, methanol, ethanol, and a mixture thereof.

12. A paste for forming an electrically conductive layer comprising a metal solution consisting of an effective amount of metal C1 to C12 aliphatic carboxylate having 1 to 3 carboxyl groups and a reactive organic solvent for dissolving the metal aliphatic carboxylate, the reactive solvent having a heteroatom P, S, O, or N; metal powder; a binder; and a residual amount of a polar or non-polar viscosity modulating solvent that modulates viscosity of the paste to at least about 10,000 cPs.

13. The paste for forming an electrically conductive layer according to claim 12, wherein the metal is silver, the silver solution is contained in an amount of 0.1 to 90 w %, the silver powder are contained in an amount of 1 to 95 w %, and the binder is contained in an amount of 0.1 to 15 w %.

14. The paste for forming an electrically conductive layer according to claim 13, wherein the reactive organic solvent is selected from the group consisting of an amine substituted by one or more C1 to C6 aliphatic group and a linear or branched C1 to C16 aliphatic thiol.

15. The paste for forming an electrically conductive layer according to claim 14, wherein the silver aliphatic carboxylate is substituted by an amino group, a nitro group, or a hydroxyl group, and the C1 to C6 aliphatic group of the amine as the reactive organic solvent is substituted with a nitro group, or a hydroxyl group.

16. The paste for forming an electrically conductive layer according to claim 14, wherein the silver powder has an average particle diameter of micrometer scale.

17. The paste for forming an electrically conductive layer according to claim 16, wherein the silver aliphatic carboxylate is selected from the group consisting of silver citrate, silver oxalate, silver formate, silver maleate and a mixture thereof.

18. The paste for forming an electrically conductive layer according to claim 17, wherein the binder is a polymeric compound.

19. The paste for forming an electrically conductive layer according to claim 18, wherein the reactive organic solvent is selected from the group consisting of methylamine, ethylamine, isopropylamine, monoethanolamine, diethanolamine, triethanolamine, or a linear, saturated aliphatic thiol containing 5 to 14 carbon atoms.

20. The paste for forming an electrically conductive layer according to claim 19, wherein the binder is a thermosetting binder, and is contained in an amount of 1 to 13 w %, and the silver solution is contained in an amount of 0.1 to 40 w %.

21. The paste for forming an electrically conductive layer according to claim 20, wherein the polar or non-polar solvent is C1 to C4 aliphatic xalcohol having a mono- to tri-valent hydroxyl group, C2 to C8 alkyl ether of the aliphatic alcohol or C2 to C8 alkyl ester of the aliphatic alcohol.

22. The paste for forming an electrically conductive layer according to claim 21, wherein the polar or non-polar solvent is selected from the group consisting of butylcarbitol acetate, butylcarbitol, ethylcarbitol, ethylcarbitol acetate, terpineol, texanol, menthanol, isoamyl acetate, methanol, ethanol, and a mixture thereof.

* * * * *